United States Patent
Reinmuth

(10) Patent No.: US 9,227,837 B2
(45) Date of Patent: Jan. 5, 2016

(54) SENSOR AND METHOD FOR MANUFACTURING A SENSOR

(71) Applicant: Robert Bosch GmbH, Stuttgart (DE)

(72) Inventor: Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/609,737

(22) Filed: Jan. 30, 2015

(65) Prior Publication Data

US 2015/0232327 A1    Aug. 20, 2015

(30) Foreign Application Priority Data

Feb. 18, 2014   (DE) .......................... 10 2014 202 923

(51) Int. Cl.
| | |
|---|---|
| H01L 29/84 | (2006.01) |
| B81B 7/00 | (2006.01) |
| B81C 1/00 | (2006.01) |
| B81B 5/00 | (2006.01) |
| B81B 3/00 | (2006.01) |

(52) U.S. Cl.
CPC ............ *B81B 7/0048* (2013.01); *B81B 3/0048* (2013.01); *B81B 3/0054* (2013.01); *B81B 5/00* (2013.01); *B81B 7/0006* (2013.01); *B81B 7/0016* (2013.01); *B81C 1/0015* (2013.01); *B81C 1/0019* (2013.01); *B81C 1/00198* (2013.01); *B81C 1/00325* (2013.01); *B81C 1/00666* (2013.01); *B81B 2201/0235* (2013.01); *B81B 2201/0242* (2013.01)

(58) Field of Classification Search
CPC .. B81B 3/0054; B81B 3/0048; B81B 3/0062; B81B 3/0078; B81B 5/00; B81B 7/0016; B81B 1/0015; B81B 1/00198
USPC ............................................ 257/417; 438/52
See application file for complete search history.

(56) References Cited

U.S. PATENT DOCUMENTS

| | | | | |
|---|---|---|---|---|
| 2004/0061962 | A1* | 4/2004 | Kwon | B81B 3/0051 359/876 |
| 2004/0084208 | A1* | 5/2004 | Ives | H05K 1/0271 174/260 |
| 2007/0292981 | A1* | 12/2007 | Aksyuk | B81C 1/00801 438/52 |
| 2012/0312094 | A1* | 12/2012 | Uchida | G01C 19/5628 73/504.04 |
| 2015/0041927 | A1* | 2/2015 | Geisberger | G01P 15/125 257/415 |
| 2015/0054101 | A1* | 2/2015 | Reinmuth | B81B 3/0078 257/420 |

* cited by examiner

*Primary Examiner* — George Fourson, III
(74) *Attorney, Agent, or Firm* — Kenyon & Kenyon LLP

(57) ABSTRACT

A sensor includes: a substrate, a microelectromechanical structure, and a decoupling structure. The decoupling structure is anchored on the substrate, and the microelectromechanical structure is anchored on the decoupling structure. The microelectromechanical structure and the decoupling structure are movable in relation to the substrate. The decoupling structure is situated between the microelectromechanical structure and the substrate.

12 Claims, 12 Drawing Sheets

SENSOR AND METHOD FOR MANUFACTURING A SENSOR

BACKGROUND OF THE INVENTION

1. Field of the Invention

The present invention relates to a sensor having a microelectromechanical structure.

2. Description of the Related Art

Such sensors are generally known. For example, acceleration sensors and rotation rate sensors are known, which have a substrate and a detection element movable in relation to the substrate. In the known sensors, the detection element is comparatively strongly influenced by mechanical tensions of the substrate. Decoupling the detection element from the mechanical tensions is only achievable with comparatively great effort.

BRIEF SUMMARY OF THE INVENTION

It is an object of the present invention to provide a sensor and a method for manufacturing a sensor, improved decoupling of the detection element from mechanical tensions being achieved in comparison to the related art and, in addition, the manufacture of the sensor being simplified.

The sensor according to the present invention and the method according to the present invention for manufacturing a sensor have the advantage over the related art that the microelectromechanical structure (MEMS structure) (along a projection direction oriented perpendicularly to a main extension plane of the substrate and toward the substrate) is situated underneath the decoupling structure—in particular a stress decoupling plate—or overlaps therewith and in particular is not situated (directly) on the substrate. For example, this means that the MEMS structure is situated or is anchored on the substrate primarily (or even exclusively) indirectly via the decoupling structure on the substrate.

Due to a comparatively high similarity of the structure of the sensor according to the present invention, it is advantageously possible to use the known MEMS arrangements (of the rotation rate sensors and/or acceleration sensors), so that the manufacture of the sensor is simplified in spite of the improved decoupling in relation to mechanical tensions.

Within the scope of the present invention, the term "mechanical tension" includes all types of mechanical tensions, i.e., mechanical tensions which act with or without external influences in the sensor. For example, these may be thermally induced mechanical tensions or mechanical tensions induced by external force influences. In particular, the decoupling structure is configured in such a way that the microelectromechanical structure is decoupled from mechanical tensions of the substrate on the whole so that the mechanical tensions of the substrate influence the sensor signal only negligibly or not at all. In particular, this decoupling is also referred to here as stress decoupling. In particular, in the sensor according to the present invention, the decoupling structure is configured for decoupling the microelectromechanical structure from mechanical tensions and/or oscillations of the substrate.

The method according to the present invention advantageously allows the manufacture of the sensor without layout restrictions, i.e., the manufacturing steps for manufacturing known MEMS structures may be adopted unchanged.

In particular, the sensor is a rotation rate and/or acceleration sensor.

According to one preferred refinement, it is provided that
only the decoupling structure is tied spring-elastically to the substrate, the decoupling structure in particular being tied to the substrate via a spring structure, or
the microelectromechanical structure and the decoupling structure are each tied spring-elastically to the substrate.

Hereby, it is advantageously possible to achieve the decoupling of the microelectromechanical structure from mechanical tensions, the sensor nonetheless being manufactured in a particularly simple way.

According to another preferred refinement, it is provided that the microelectromechanical structure is connected to the decoupling structure via a dielectric insulation layer.

Hereby, it is advantageously possible to contact the microelectromechanical structure via an electrically conductive connection and to use the decoupling structure, for example, for the capacitive detection of a deflection of the microelectromechanical structure.

According to another preferred refinement, it is provided that the microelectromechanical structure is anchored via a further spring structure on the substrate, in particular the further spring structure being configured in such a way that the microelectromechanical structure is electrically conductively contactable via the further spring structure.

Hereby, it is advantageously possible to use the further spring structure for the electrical contacting of the microelectromechanical structure. In particular, the further spring structure has a lesser spring stiffness than the spring structure which anchors the decoupling structure on the substrate. For example, the stress decoupling is primarily achieved by the spring structure (and not or only negligibly by the further spring structure).

According to another preferred refinement, it is provided that the substrate has a channel structure on a side facing the decoupling structure, the channel structure in particular primarily extending along a main extension plane of the substrate in an area between the substrate and the decoupling structure.

Hereby, it is advantageously possible to achieve an undercut of the decoupling structure during the release of the microelectromechanical structure in a particularly efficient way. In particular, the channel structure is an etching acceleration structure to enable release of the decoupling structure without perforation of the decoupling structure.

According to another preferred refinement, it is provided that the spring structure is configured in such a way that the decoupling structure is decoupled in relation to mechanical tensions of the substrate and/or in relation to oscillations externally applied to the substrate, in particular the decoupling structure having a higher mechanical stiffness than the spring structure.

Hereby, it is advantageously possible to provide a sensor which is comparatively simple to manufacture, and in which nonetheless a decoupling of mechanical tensions and/or oscillations of the substrate is implemented.

According to another preferred refinement, it is provided that the spring structure is configured for damping oscillations of the substrate with the aid of squeeze film damping.

Hereby, it is advantageously possible to carry out the decoupling in a particularly efficient way via squeeze film damping.

According to one preferred refinement of the method according to the present invention, it is provided that
the decoupling layer is a silicon layer applied on one side of the substrate, or
the decoupling layer is a further substrate bonded with the aid of a bonding method to the substrate.

Hereby, it is advantageously possible to manufacture the sensor by applying a silicon layer or alternatively to manufacture it with the aid of a wafer bonding method, the substrate of a first wafer being connected to the decoupling layer (a further substrate) of a second wafer with the aid of a wafer bonding method.

According to another preferred refinement of the method according to the present invention, it is provided that, in the seventh manufacturing step, the decoupling structure and the microelectromechanical structure are released, so that the microelectromechanical structure and the decoupling structure are movable in relation to the substrate.

Hereby, it is advantageously possible to manufacture the sensor in a particularly simple and efficient way.

According to another preferred refinement of the method according to the present invention, it is provided that in a second manufacturing step, a dielectric layer is applied to the side of the substrate and/or to the decoupling layer, in particular, in a third manufacturing step, a recess extending through the dielectric layer being produced for a contact area for the electrically conductive contacting of the substrate.

According to another preferred refinement of the method according to the present invention, it is provided that in a fifth manufacturing step, a further dielectric layer is applied to the decoupling layer, in particular, in a sixth manufacturing step, a further recess extending through the further dielectric layer being produced for a further contact area for the electrically conductive contacting of the decoupling structure.

According to the present invention, the numbering of the manufacturing steps refers to a logical sequence. However, the numbering of the manufacturing steps may also correspond according to the present invention to a chronological sequence of the manufacturing steps.

Exemplary embodiments of the present invention are illustrated in the drawings and explained in greater detail in the following description.

DETAILED DESCRIPTION OF THE INVENTION

Figure 1:
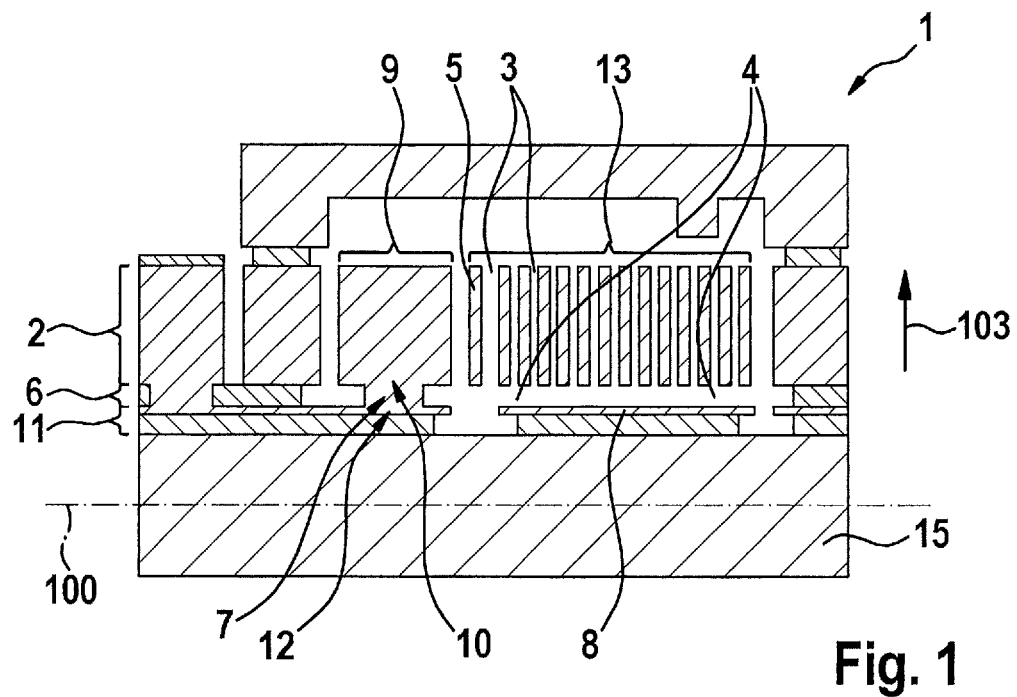
FIG. 1 shows an example embodiment of a sensor according to the present invention.

In the various figures, identical parts are always provided with identical reference numerals and are therefore generally also only cited or mentioned once in each case.

FIG. 1 shows a sensor 1, in particular an acceleration and/or rotation rate sensor, according to one specific embodiment of the present invention in a sectional view, a basic structure of sensor 1 primarily being described here. The basic structure includes here a microelectromechanical element (MEMS element) 1', which is movable in relation to a substrate 15 of sensor 1, and an anchor structure 9, to which MEMS element 1' is spring-elastically coupled. A deflection or deflection movement of movable element 1' is detectable by sensor 1 as a function of capacitance changes.

Movable MEMS element 1' is produced from a (comparatively thick) polysilicon layer 2 (epi-poly layer), which is deposited epitactically (on substrate 15 of sensor 1), with the aid of an etching method. Polysilicon layer 2 has—in particular in an area of movable MEMS element 1'—multiple trenches 3 having a relatively high aspect ratio. A high aspect ratio means that a lateral extension (in parallel to a main extension plane 100 of substrate 15) of a trench 3 is less than an extension of the trench along a normal direction 103 (perpendicular to main extension plane 100 of substrate 15). During the manufacturing method, MEMS element 1' is released by removing a sacrificial layer, in particular an oxide layer, under (thick) polysilicon layer 2 in the area of MEMS element 1' (indicated in FIG. 1 by reference numeral 4). Movable MEMS element 1' additionally has in particular a perforation structure, which is configured in such a way that MEMS element 1' is undercut and therefore released in the sacrificial layer etching method.

Movable MEMS element 1' is spring-elastically anchored here on anchor structure 9 via a spring element 5, spring element 5 having multiple narrow and long spring sub-elements here. In this way, an elastically suspended (i.e., spring-elastically coupled to anchor structure 9) movable structure 1' is produced, which is movable in relation to anchor structure 9.

A further polysilicon layer 6 (which is thinner in comparison to the polysilicon layer) is situated here in particular underneath polysilicon layer 2. Further polysilicon layer 6 has here, for example, a suspension area 7 for anchoring structure 9 and/or an electrode structure 8 under movable MEMS structure 1' and/or a printed conductor structure.

Anchor structure 9 of the basic structure is electrically conductively contactable here via a contact area 10 between polysilicon layer 2 and further underlying polysilicon layer 6 (see reference numeral 12). Further polysilicon layer 6 is connected here to an underlying oxide layer 11 (in particular an electrically insulating layer). Polysilicon layer 6 is provided to be wide here to such an extent in particular (with respect to an extension in parallel to main extension plane 100 of substrate 15) that an underlying oxide layer 11 is not completely removed in the sacrificial layer etching method.

In FIG. 1, the basic structure is anchored on substrate 15 (for example, anchor structure 9 is shown in FIG. 1 as a part of a main structure of the sensor which is fixedly connected to the substrate). According to the present invention, sensor 1 preferably has the basic structure in the arrangement according to the specific embodiment shown in FIG. 2.

Figure 2:
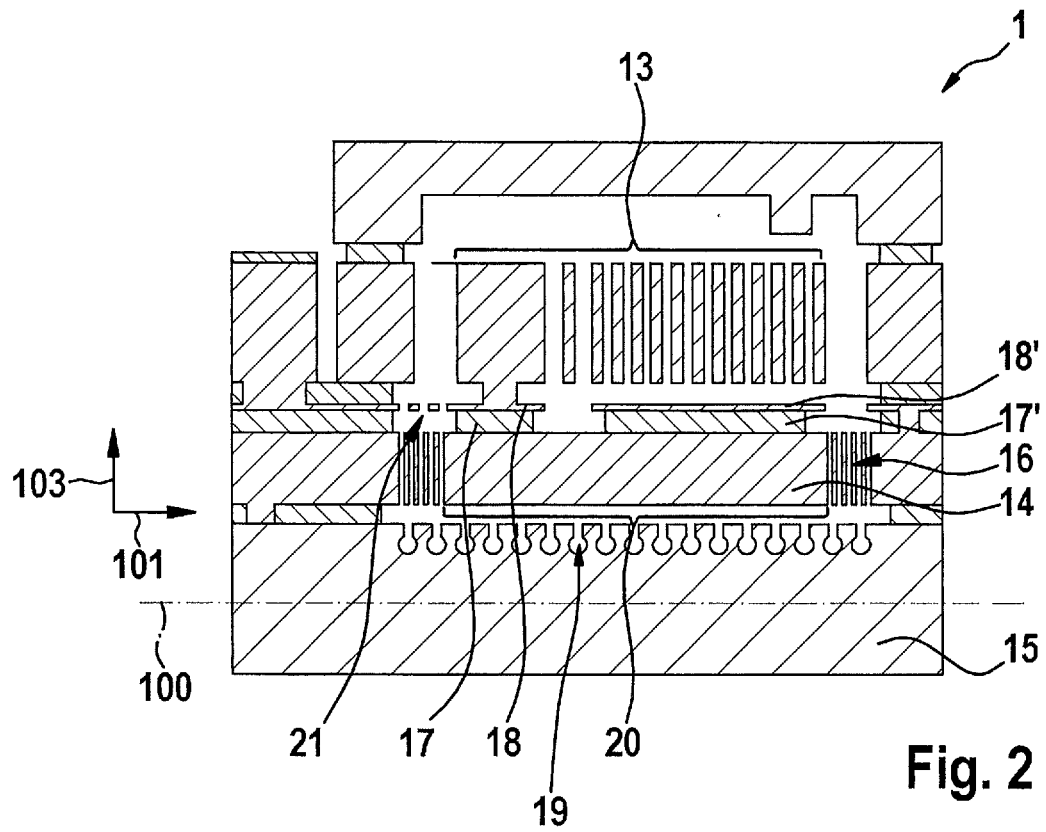
FIG. 2 shows an example embodiment of a sensor according to the present invention in a sectional view.

FIG. 2 shows a sensor 1 according to one specific embodiment of the present invention in a sectional view. The specific embodiment shown here includes in particular the basic structure according to FIG. 1, sensor 1 additionally having a decoupling structure 14 here. This means that sensor 1 includes substrate 15, a microelectromechanical structure 13 (which essentially corresponds in particular to anchor structure 9 and MEMS element 1') and decoupling structure 14, decoupling structure 14 being anchored on substrate 15 here. Microelectromechanical structure 13 is anchored here on decoupling structure 14, microelectromechanical structure 13 and decoupling structure 14 being movable in relation to substrate 15. Decoupling structure 14 (in particular along a projection direction in parallel to normal direction 103) is situated here between microelectromechanical structure 13 and substrate 15 of sensor 1.

On the basis of the following figures, the manufacturing method according to the present invention for manufacturing a sensor will be described as an example. The manufacturing method relates in particular to manufacturing a stress-decoupled MEMS structure 13 having a cap wafer.

In a first manufacturing step, a channel structure 19 (i.e., narrow trenches which function in a subsequent manufacturing step, in particular during the release, as etching channels) is produced (i.e., "trenched" into the substrate) on one side of the substrate 15 (which preferably is made of monocrystalline silicon) via a lacquer mask. The channel structure is produced in particular on the side of substrate 15 in the area in which decoupling structure 14 (stress decoupling plate) and in particular vertical etching accesses are situated. The trenches of channel structure 19 preferably have a high aspect ratio (i.e., a ratio of width—in parallel to main extension plane 100 of substrate 15—to height—in parallel to normal direction 103—greater than 2).

Figure 3:
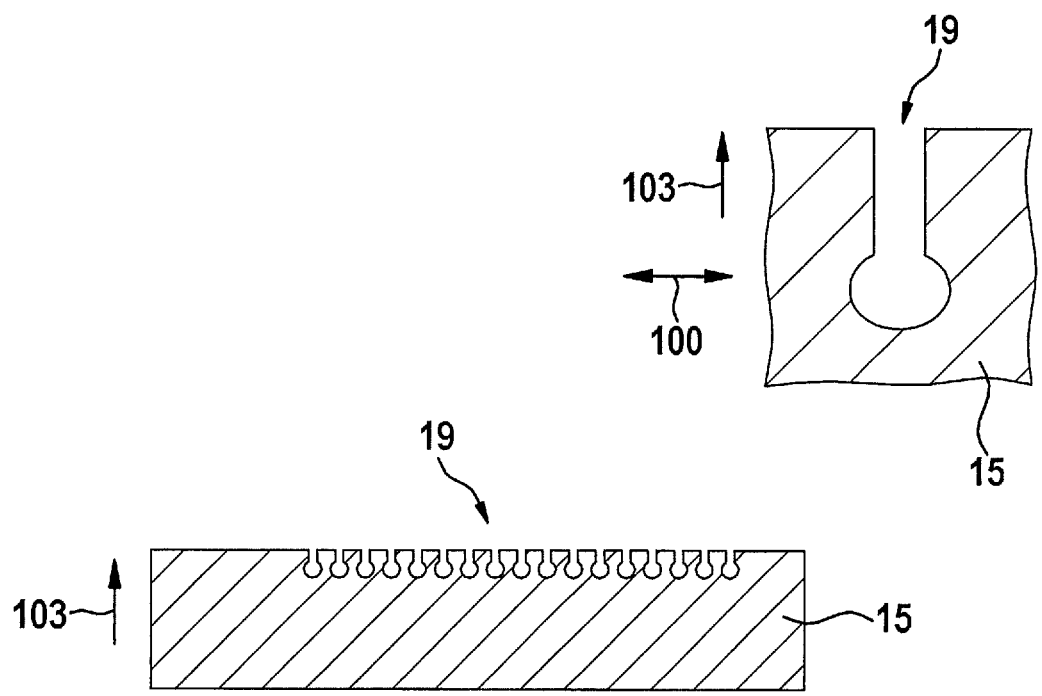
FIG. 3 shows a channel structure provided in a manufacturing step for a sensor according to the present invention.

FIG. 3 shows a channel structure 19, the trenches here each having a comparatively narrow (in particular tubular) entrance area in the area of the surface of substrate 15 and an inner area connected via the entrance area. The inner area of a trench of channel structure 19 has in particular a greater width (in parallel to main extension plane 100 of the substrate) than the entrance area (the trenches are preferably essentially cup-shaped). The trenches of channel structure 19 are advantageously manufactured simply and efficiently with the aid of a cyclic trenching process, which ends with a comparatively long-lasting isotropic etching step. The trenches preferably have an opening width (i.e., the width of the entrance area) of less than 30 pm, particularly preferably less than 20 pm, very particularly preferably less than 10 pm.

In a second manufacturing step, the trenches of channel structure 19 are closed (in particular with the aid of thermal oxidation or oxide deposition—for example, a tetraethyl orthosilicate (TEOS)—or chemical gas phase deposition (CVD), in particular silane-CVD deposition) in such a way that a cavity is enclosed underneath the oxide layer in a large part of the trench.

Figure 4:
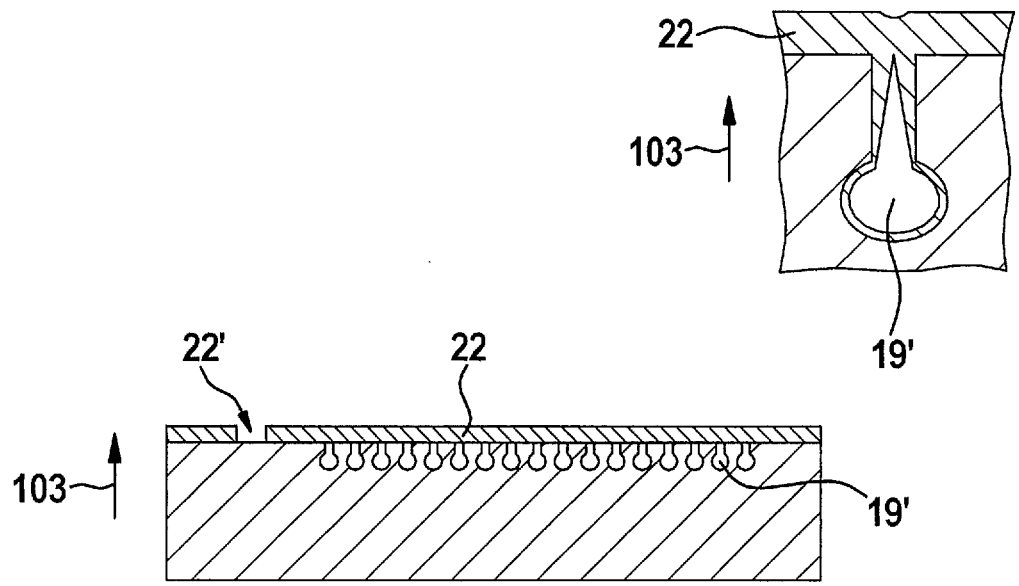
FIG. 4 shows channel structure including a dielectric layer closing channel structure in a manufacturing step for a sensor according to the present invention.

FIG. 4 shows channel structure 19 including a dielectric layer 22 closing channel structure 19. In a third manufacturing step, a recess extending through dielectric layer 22 is produced (etched) for a contact area 22' for the electrically conductive contacting of substrate 15.

Figure 5:
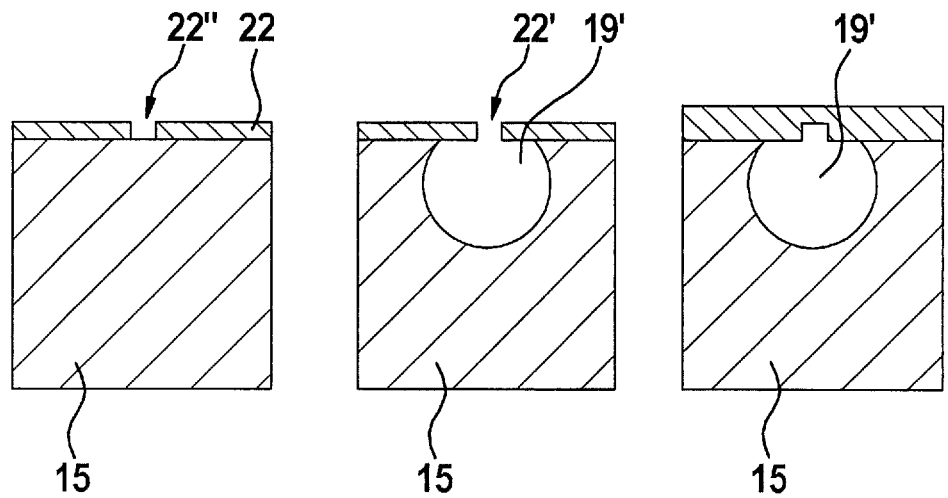
FIG. 5 shows an alternative second and third manufacturing step of the method according to the present invention.

FIG. 5 shows an alternative second and third manufacturing step of the method according to the present invention. Perforation holes for reducing the maximum undercut width are produced and/or trenches of channel structure 19 (etching channels) having a comparatively large diameter are produced in decoupling structure 14 (stress decoupling plate). In an alternative second manufacturing step, a first partial layer of dielectric layer 22 (oxide layer) is deposited on substrate 15. Subsequently, etching accesses 22" are etched into the first partial layer of dielectric layer 22 (FIG. 5, left side). Subsequently, etching channel 19' is etched into substrate 15 using an (isotropic) silicon etching step (for example, using SF6 plasma). The first partial layer is significantly undercut (FIG. 5, middle). In an alternative third manufacturing step, a further partial layer of dielectric layer 22 is deposited, so that etching accesses 22" in the first partial layer are closed. An etching channel 19' having a comparatively large diameter is thus applied in substrate 15 (FIG. 5, right side).

Figure 6:
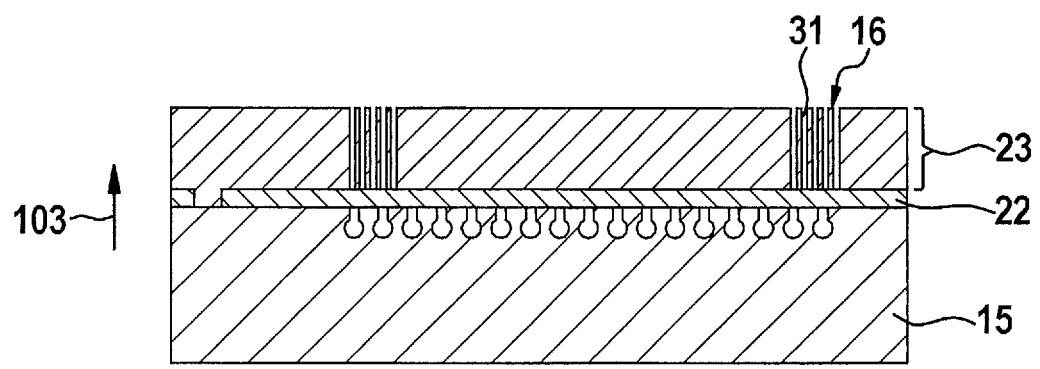
FIG. 6 illustrates a fourth manufacturing step.

FIG. 6 illustrates a fourth manufacturing step. A (comparatively thick) decoupling layer 23 (polysilicon layer) is deposited in the fourth manufacturing step. Decoupling layer 23 is preferably trenched in a trenching process in such a way that spring structure trenches 31 are produced for a spring structure 16 having a high aspect ratio (ratio of width to height greater than 5).

Figure 7:
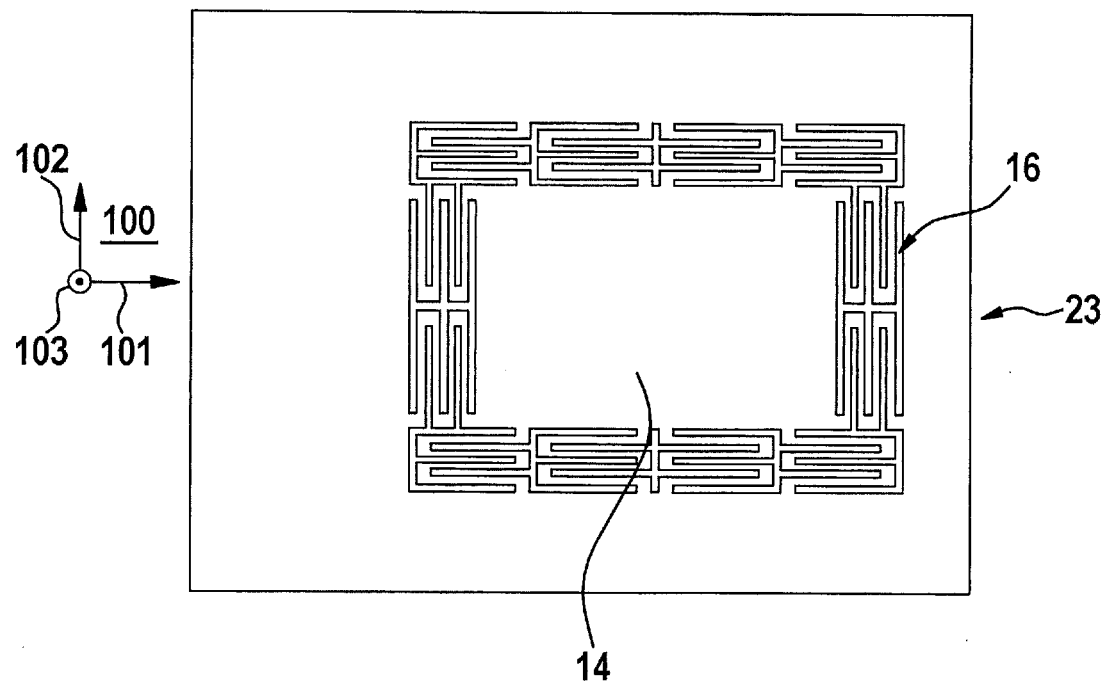
FIG. 7 shows a decoupling structure of a sensor according to one specific embodiment of the present invention.

FIG. 7 shows a decoupling structure 14 (stress decoupling plate) of a sensor 1 according to one specific embodiment of the present invention. Spring structure 16 preferably has etching accesses (spring structure trenches 31) extending completely through decoupling layer 23. In order to be able to release large areas underneath the stress decoupling plate, channel structure 19 (i.e., in particular entrance area 29 of the trenches of channel structure 19, see FIG. 18) is to be situated in such a way that spring structure trenches 31 are situated at least partially above the trenches of channel structure 19. Spring structure 16 preferably includes a multiply folded arrangement. Hereby, comparatively small distances are implemented between individual spring legs of the spring structure. In a particularly advantageous way, efficient damping of the system is thus achieved due to a comparatively small distance between the spring legs (squeeze film damping).

Figure 8:
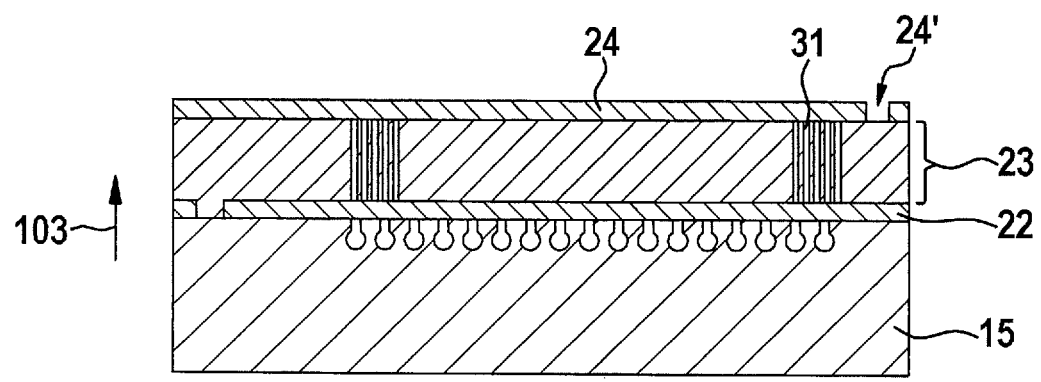
FIG. 8 illustrates a fifth and sixth manufacturing step.

FIG. 8 illustrates a fifth and sixth manufacturing step. In the fifth manufacturing step, spring structure trenches 31 (which are associated with stress decoupling plate 14) are closed by a further dielectric layer 24 (via thermal oxidation or preferably via oxide deposition—for example, using a TEOS or silane-CVD deposition), in particular a cavity having an elongated vertical extension being enclosed in partial areas of spring structure trenches 31. In the sixth manufacturing step, a further contact area 24' for the electrically conductive contacting of stress decoupling plate 14 is produced in further dielectric layer 24.

The substructure shown in FIG. 8 is manufactured by the first through sixth manufacturing steps. For example, the basic structure is situated on this substructure to finish sensor 1.

The third and sixth manufacturing steps are preferably optional.

Figure 9:
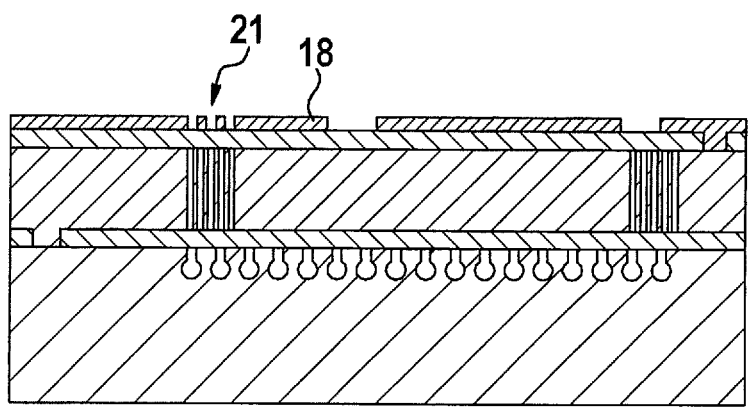
FIG. 9 shows an example embodiment of a substructure of sensor according to the present invention.
Figure 10:
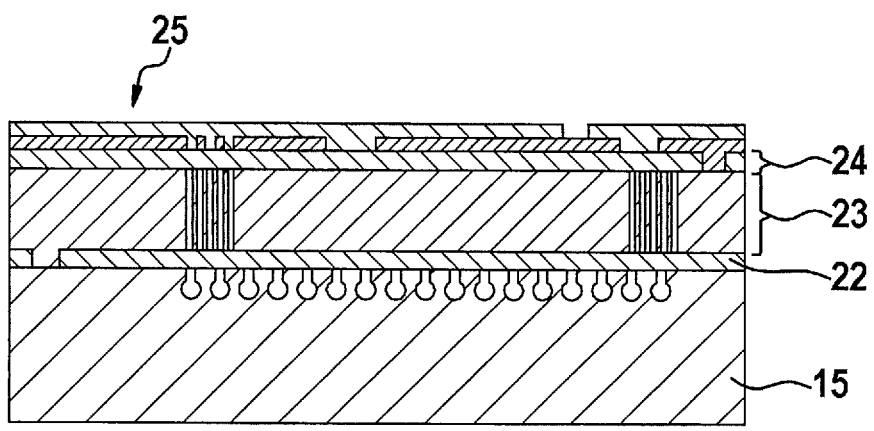
FIGS. 10 through 18 show the remaining manufacturing steps for a sensor according to the present invention.
Figure 11:
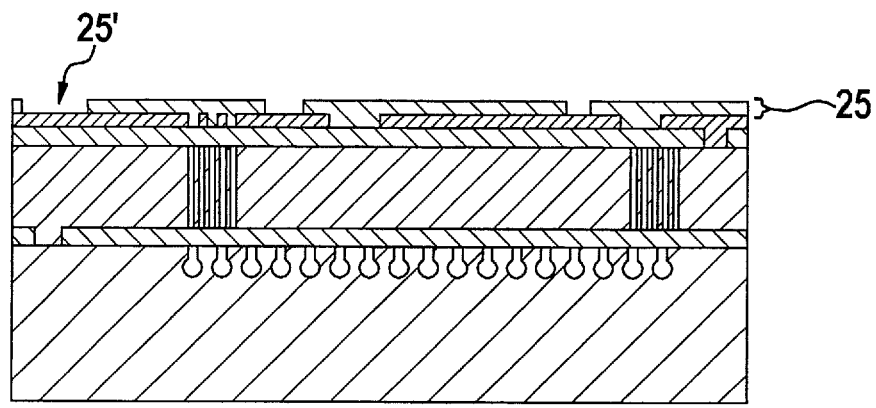
Figure 12:
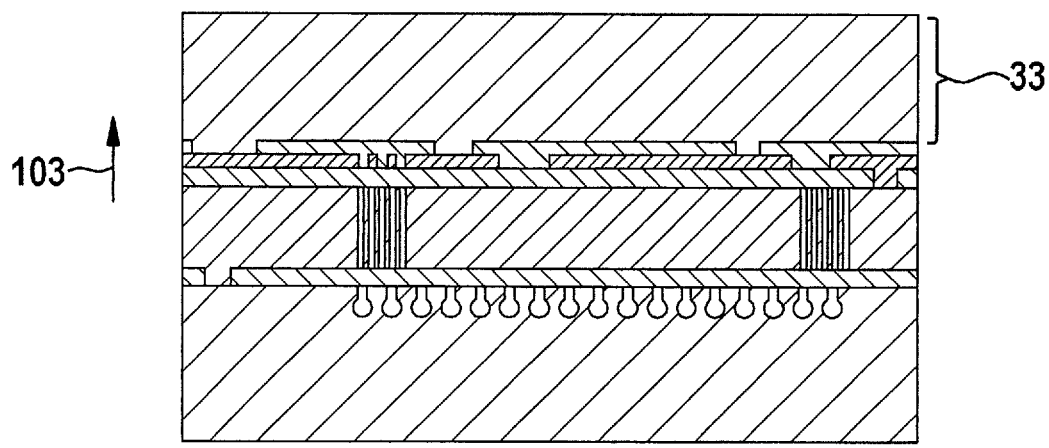
Figure 13:
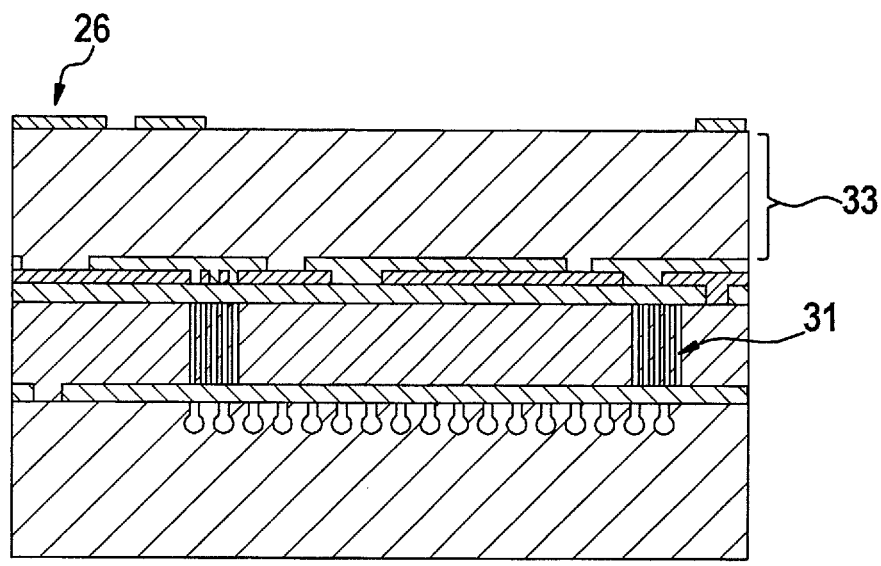
Figure 14:
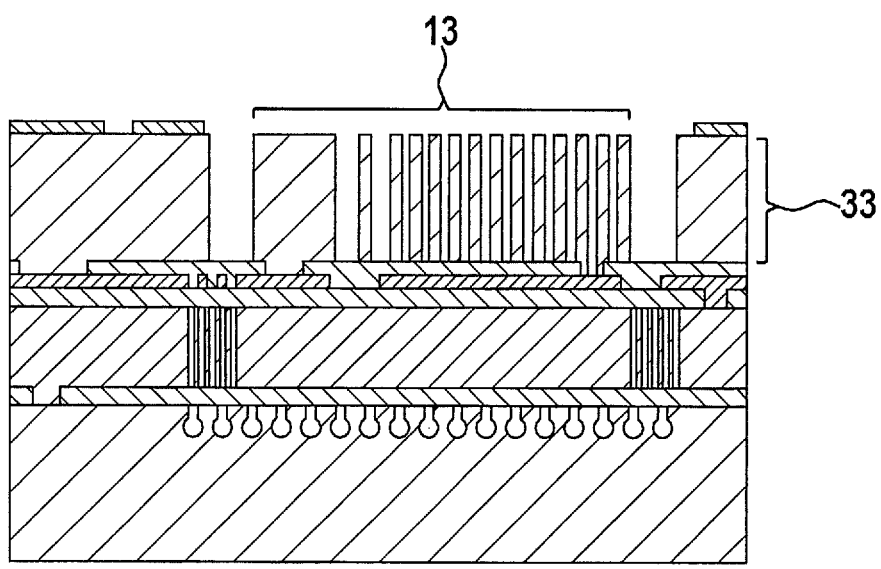
Figure 15:
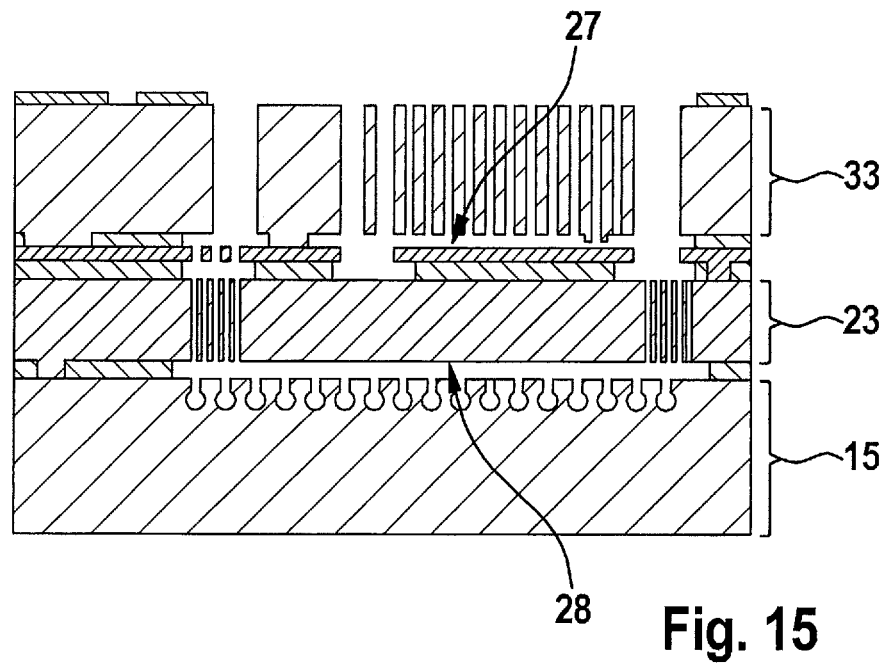
Figure 16:
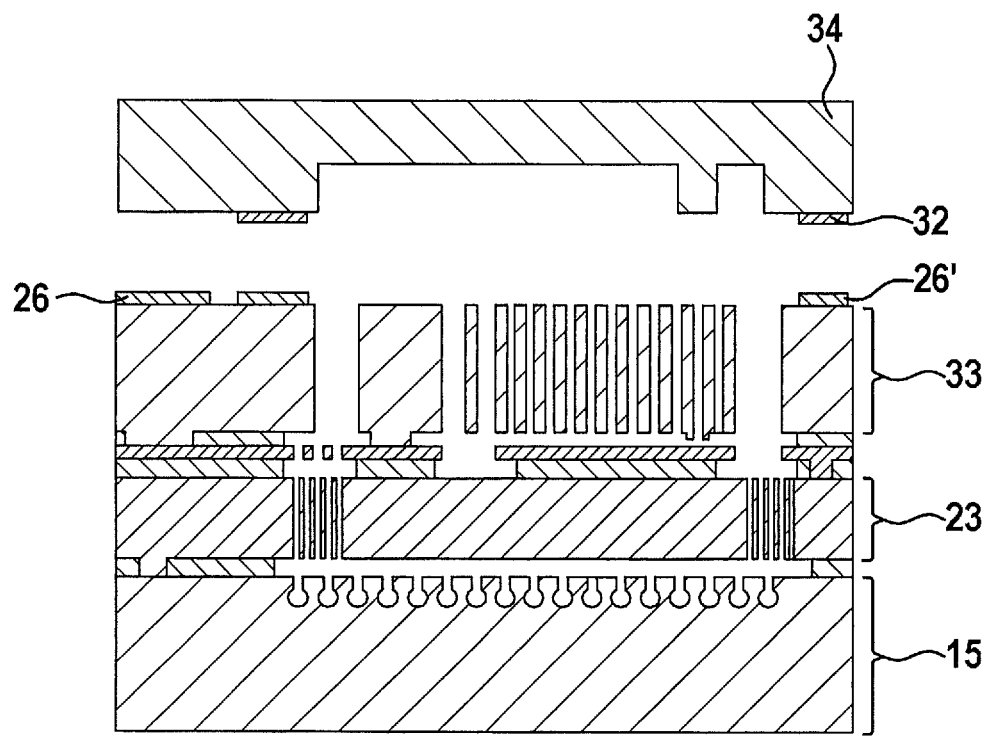
Figure 17:
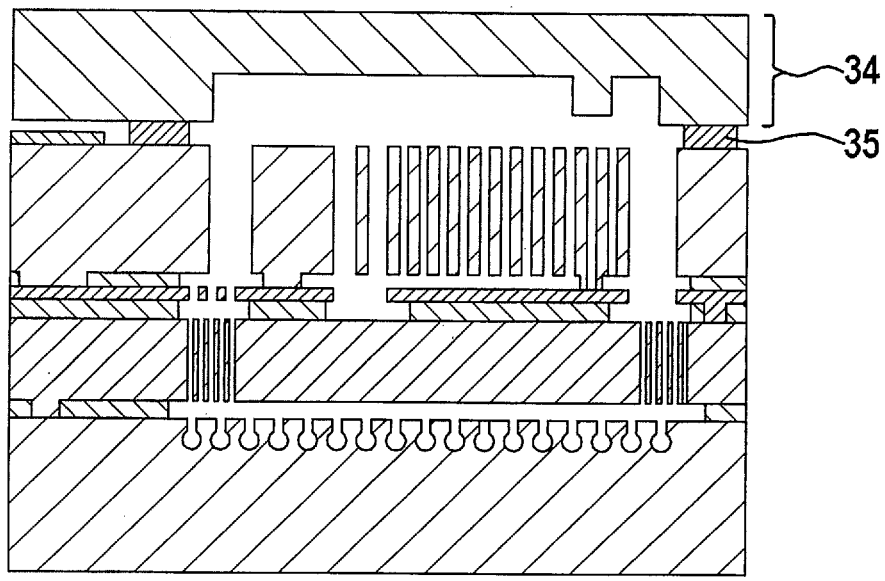
Figure 18:
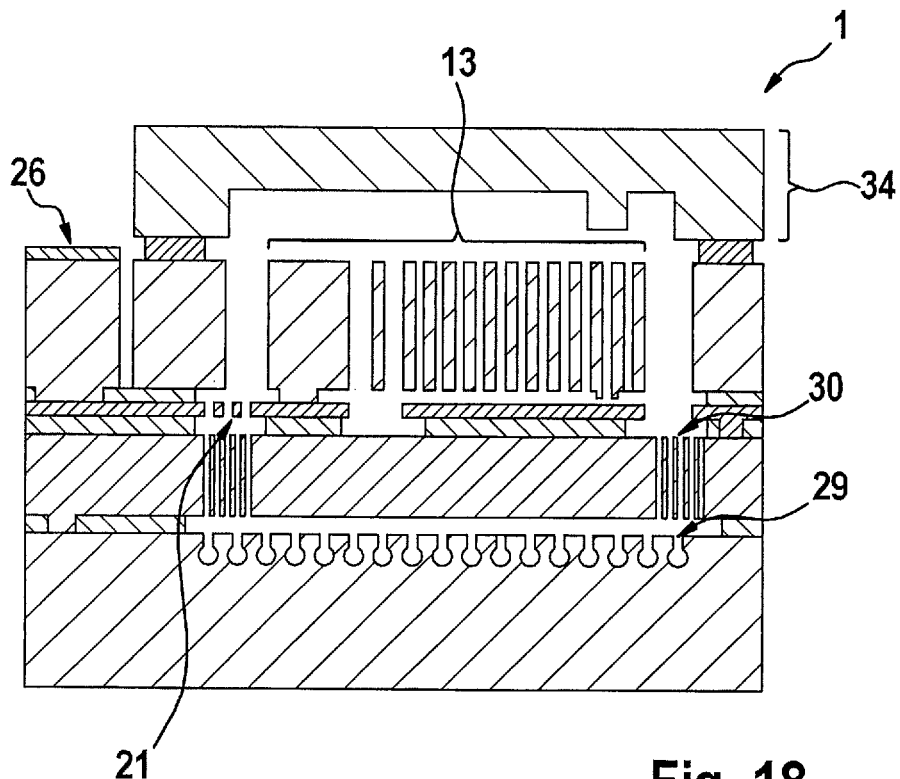

FIG. 9 shows a specific embodiment of a substructure of sensor 1 according to the present invention, a buried printed conductor structure 18 (polysilicon printing conductor) being situated on further dielectric layer 24 here. Printed conductor structure 18 preferably includes a further spring structure 21, which is configured in such a way that electrical sensor signals are conducted via further spring structure 21 (of "buried" polysilicon printed conductor 18) (which is very soft in relation to spring structure 16) from MEMS element 1' to the chip edge (see reference numeral 26 in FIG. 18). In the areas in which a mechanical connection is provided between stress decoupling plate 14 and MEMS structure 13', printed conductor structure 18 is preferably laterally extended (in parallel to main extension plane 100 of substrate 15) in such a way that the undercut oxide area is not situated underneath anchor structure 9. Furthermore, printed conductor structure 18 in particular has a layer thickness which is thinner than a layer thickness of the decoupling layer (i.e., thinner by at least a factor of 2.5). In such an arrangement, different intrinsic mechanical tensions and/or different coefficients of expansion between oxide material and silicon material have the effect that the comparatively thin polysilicon layer is advantageously bent in its outer areas. Hereby, bending of stress decoupling plate 14 and/or MEMS structure 13 may advantageously be prevented. A functional layer 33 deposited thereon (from which MEMS structure 13 is formed, see FIG. 12) particularly preferably additionally has a perforation structure, which is implemented in the area of the MEMS structure in such a way that no oxide remains between functional layer 33 and relatively thin polysilicon layer 18. FIG. 10 shows still a further dielectric layer 25, which is deposited on printed conductor structure 18 (along a projection direction in parallel to normal direction 103). Still further recesses 25' in dielectric layer 25 are shown in FIG. 11. FIGS. 12 through 13 illustrate the seventh manufacturing step, in which functional layer 33 is deposited. Hereby, in particular further contact structures 26 are produced and initially MEMS structure 13 and subsequently decoupling structure 14 are released (see reference numerals 27, 28 in FIG. 15). In an eighth manufacturing step illustrated in FIG. 16, a cap structure 34 of a cap wafer is provided, which is situated in a wafer bonding process on functional layer 33, in particular connecting points 32 of cap wafer structure 34 being connected to corresponding connecting structures 26' (which are connected to functional layer 33) to form a wafer bond 35. FIG. 18 shows a finished structure 1 according to one specific embodiment of the present invention.

Figure 19:
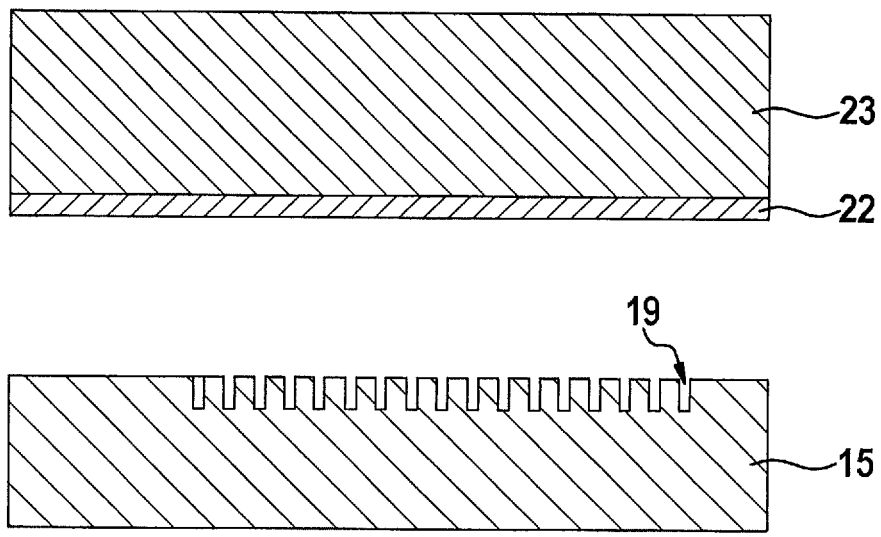
FIGS. 19 through 23 show an alternative manufacturing method according to the present invention.
Figure 20:
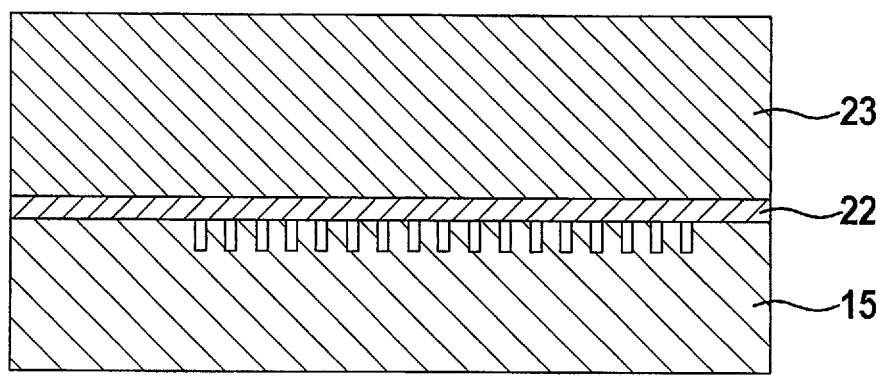
Figure 21:
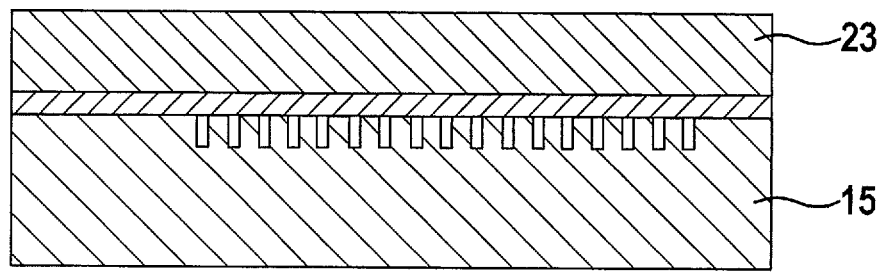
Figure 22:
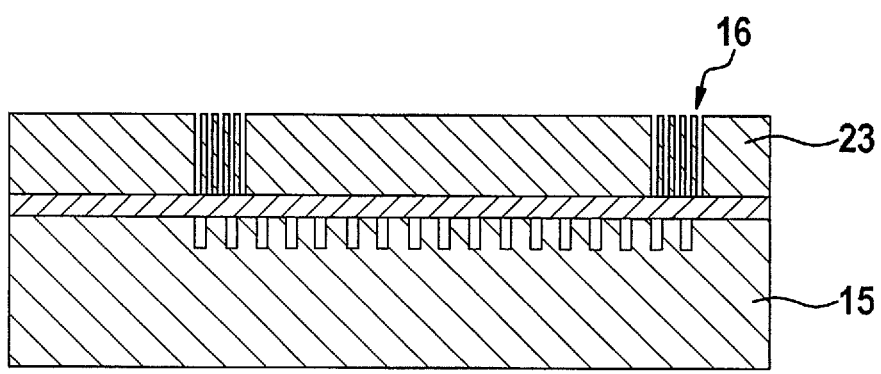
Figure 23:
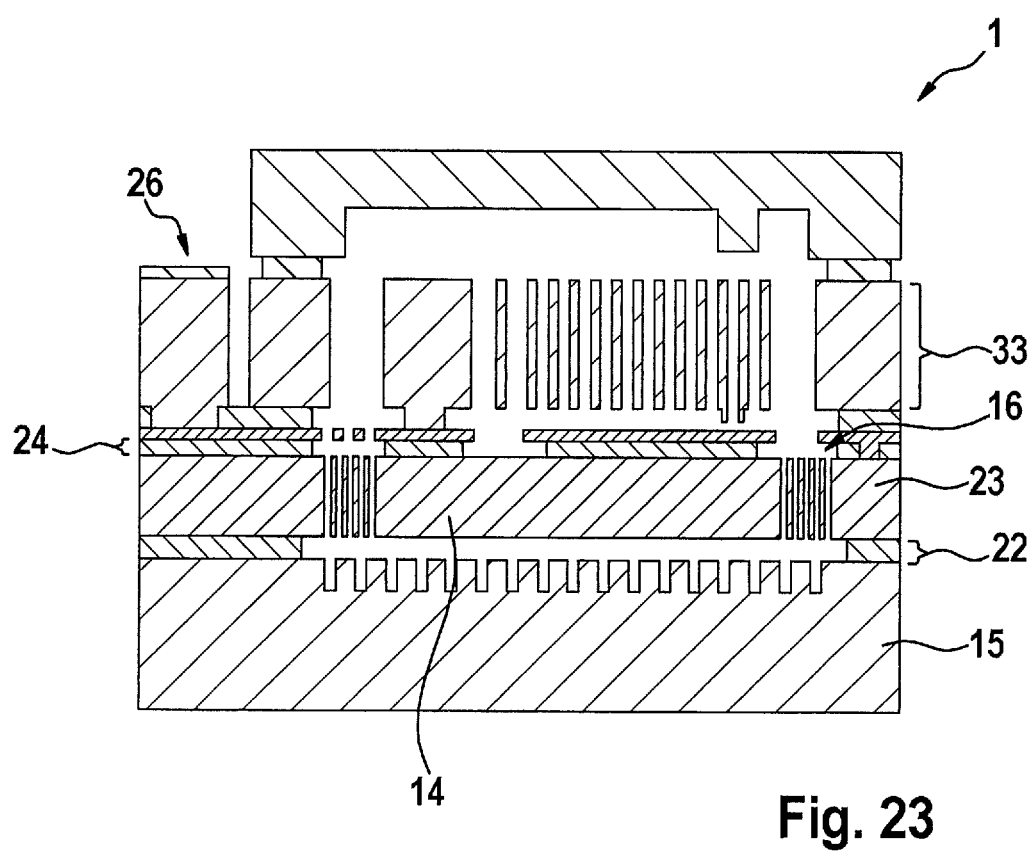

FIGS. 19 through 23 show an alternative manufacturing method according to the present invention. FIG. 19 illustrates a first manufacturing step, a substrate 15 being provided, which is preferably a (silicon) substrate 15 of a first (silicon) wafer. Subsequently, in particular a channel structure 19 is etched into substrate 15. In a fourth manufacturing step, a decoupling layer 23 (a further substrate 23 here of a second (silicon) wafer) is connected (bonded) to substrate 15 of the first wafer via a direct bonding method. In particular, an insulation layer 22 (oxide layer) is deposited onto substrate 15 and/or further substrate 23 between the two substrates 15, 23 prior to the bonding method. FIG. 20 shows that the bond connection is situated on the side of channel structure 19 of substrate 15 of the first wafer. FIG. 21 shows that further substrate 23 of the second wafer is ground to a target thickness of decoupling structure 14 (stress decoupling plate). FIG. 22 illustrates a spring structure 16, which is produced from decoupling structure 14 of further substrate 23—preferably using a trenching process having a high aspect ratio (i.e., an aspect ratio of width to height greater than 5). In particular, the trenches of spring structure 16 and/or perforations of stress decoupling plate 14 are subsequently closed via a thermal oxidation or preferably via an oxide deposition, for example, using a TEOS or silane-CVD deposition, whereby a cavity having an elongated extension along a projection direction in parallel to normal direction 103 is enclosed in partial areas in particular. In particular, a contact area for the electrically conductive contacting of stress decoupling plate 14 is etched into the oxide layer. Hereby, an alternative substructure for sensor 1 according to the present invention is provided. FIG. 23 shows a finished sensor 1 having the alternative substructure.

Sensor 1 according to one of the specific embodiments of the present invention has suspension springs (for example, further spring structures 21 or other springs) in functional layer 33 of MEMS structure 13 and also has suspension springs (for example, spring structure 16) in decoupling layer 23 of decoupling structure 14. In particular, a gravity center of a unit made up of stress decoupling plate 14 including MEMS structure 13 anchored thereon is situated in such a way that upon application of a horizontal acceleration, the unit is only accelerated linearly (and therefore, no tilting movement of the unit occurs). Hereby, it is advantageously possible that stress decoupling plate 14 is also configured for oscillation decoupling.

What is claimed is:

1. A sensor, comprising:
   a substrate;
   a microelectromechanical structure; and
   a decoupling structure anchored on the substrate;
   wherein the microelectromechanical structure is anchored on the decoupling structure, and wherein the microelectromechanical structure and the decoupling structure are movable in relation to the substrate, and wherein the decoupling structure is situated between the microelectromechanical structure and the substrate.

2. The sensor as recited in claim 1, wherein one of:
   (i) only the decoupling structure is spring-elastically tied to the substrate; or
   (ii) the microelectromechanical structure and the decoupling structure are each spring-elastically tied to the substrate.

3. The sensor as recited in claim 2, wherein the microelectromechanical structure is connected to the decoupling structure via a dielectric insulation layer.

4. The sensor as recited in claim 2, wherein the microelectromechanical structure is anchored on the substrate via a further spring structure configured in such a way that the microelectromechanical structure is electrically conductively contactable via the further spring structure.

5. The sensor as recited in claim 2, wherein the substrate has a channel structure on a side facing the decoupling structure, the channel structure extending primarily along a main extension plane of the substrate in an area between the substrate and the decoupling structure.

6. The sensor as recited in claim 2, wherein the spring structure is configured in such a way that the decoupling structure is decoupled in relation to at least one of (i) mechanical tensions of the substrate and (ii) oscillations externally applied to the substrate.

7. The sensor as recited in claim 2, wherein the spring structure is configured for damping oscillations of the substrate with the aid of squeeze film damping.

8. A method for manufacturing a sensor having a substrate, a microelectromechanical structure, and a decoupling structure anchored on the substrate, wherein the microelectromechanical structure is anchored on the decoupling structure, and wherein the microelectromechanical structure and the decoupling structure are movable in relation to the substrate, and wherein the decoupling structure is situated between the microelectromechanical structure and the substrate, the method comprising:
   producing on one side of a substrate, in a first manufacturing step, a channel structure extending into the substrate;
   producing, in a subsequent manufacturing step following the first manufacturing step, a decoupling structure from a decoupling layer situated on a side of the substrate;
   applying, in a still further manufacturing step, a functional layer to the decoupling layer; and
   forming, from the functional layer, a microelectromechanical structure anchored on the decoupling structure.

9. The method as recited in claim 8, wherein one of:
   the decoupling layer is a silicon layer applied to the side of the substrate; or
   the decoupling layer is a further substrate connected to the substrate with the aid of a bonding method.

10. The method as recited in claim 8, wherein, in the still further manufacturing step, the decoupling structure and the microelectromechanical structure are released so that the microelectromechanical structure and the decoupling structure are movable in relation to the substrate.

11. The method as recited in in claim 8, wherein, in a second manufacturing step following the first manufacturing step, a dielectric layer is applied to at least one of the side of the substrate and the decoupling layer, and in a third manufacturing step following the second manufacturing step, a recess extending through the dielectric layer is produced for a contact area for the electrically conductive contacting of the substrate.

12. The method as recited in claim 11, wherein the subsequent manufacturing step is a fourth manufacturing step, and wherein in a fifth manufacturing step, a further dielectric layer is applied to the decoupling layer, and wherein in a sixth manufacturing step, a further recess extending through the further dielectric layer is produced for a further contact area for the electrically conductive contacting of the decoupling structure.

\* \* \* \* \*